United States Patent [19]
Carney et al.

[11] Patent Number: 5,673,175
[45] Date of Patent: Sep. 30, 1997

[54] PCI EXPANSION CARD DOUBLE-DOOR RETAINER

[75] Inventors: James M. Carney, Pepperell; Dave Desilets, Hopkinton, both of Mass.; Clifford Willis, Tracy; Lee Winick, San Jose, both of Calif.; Chris Chiodo, Andover, Mass.

[73] Assignee: Sun Microsystems, Inc., Mountain View, Calif.

[21] Appl. No.: 674,554

[22] Filed: Jul. 1, 1996

[51] Int. Cl.$^6$ ............................... G06F 1/16; H05K 7/12
[52] U.S. Cl. .................. 361/686; 361/732; 361/747; 361/759; 361/801; 292/202; 292/209
[58] Field of Search ............... 439/61, 296, 327, 439/372; 220/3.8, 4.02, 503, 524, 526, 242, 315, 324; 292/200, 202, 209; 248/27.1, 27.3; 361/683, 684, 686, 726, 732, 740, 747, 759, 801; 364/708.1

[56] References Cited

U.S. PATENT DOCUMENTS

| | | | |
|---|---|---|---|
| 4,744,006 | 5/1988 | Duffield | 361/686 |
| 4,924,355 | 5/1990 | Mitchell et al. | 361/686 |
| 4,979,075 | 12/1990 | Murphy | 361/686 |
| 5,579,210 | 11/1996 | Ruhland et al. | 361/801 X |

*Primary Examiner*—Michael W. Phillips
*Attorney, Agent, or Firm*—Julian Caplan; Flehr Hohbach Test Albritton and Herbert

[57] ABSTRACT

Computers are manufactured with connectors in which are inserted at least one PCI expansion card to increase the capacity of the computer. A computer enclosure panel is formed with first opening for insertion and withdrawal of the card. The card has a cover which blocks the first opening after the card has been plugged in. The invention provides a retainer mounted on the rear panel which engages the cover to hold one end of the card in place. The invention further provides room for the tab conventionally extending outward of the card to extend outward of the enclosure so that the card may be located closer to the side panel, thereby conserving space within the enclosure. The retainer has an apertured first door pivotally mounted on the exterior of the panel which in closed position surrounds a second opening through which the card tab protrudes and engages one face of the tab. A second door is pivotally mounted on the first door and in closed position covers the aperture in the first door. The second door has a latch which extends into the second opening and engages the cover to hold a second end of the cover in place. Computers as shipped from the factory many times are not provided with PCI cards and the opening in the panel is blocked by a removable blanking cover. The retainer also holds the blanking cover in position.

7 Claims, 5 Drawing Sheets

PCI EXPANSION CARD DOUBLE-DOOR RETAINER

BACKGROUND OF THE INVENTION

1. Field of the Invention

This invention relates to a new and improved PCI expansion card retainer clip. More particularly, the invention relates to a retainer which engages a cover fixed to such card, retaining the cover in place blocking an opening formed in a wall of the computer enclosure. The retainer comprises a first apertured door-like member, pivoted to the exterior of the enclosure and a second door-like member, pivoted to the first, which holds the inside of the cover and closes the aperture in the first door.

2. Description of Related Art

PCI cards conventionally have been sold with a vertical cover or plate along one edge having an outward extending tab. When the card is plugged into pin connectors inside the computer enclosure, the cover bloch an I/O opening in the wall of the casing. Conventionally a screw has been used to attach a tab on the cover to a bracket on the enclosure. The present invention provides a retainer for the cover which does not require use of such a screw or equivalent fastener.

SUMMARY OF THE INVENTION

The present invention comprises a removable retainer attached to a panel of a computer enclosure. In inoperative position a conventional PCI card or a blanking cover (used when no card is installed) may be installed or removed in an opening in a panel of the enclosure. When the retainer is in operative position, the card or blanking cover is secured in place. Use of the cover shields against EMI and dust and is a safety precaution.

As has been explained, heretofore a screw has been used to attach a tab extending outwardly of the cover to a bracket on the computer enclosure. Attaching and detaching such screws requires considerable manual dexterity and is time consuming. Furthermore, frequently the screw falls into the enclosure and is difficult to find and remove. Such problems are avoided by use of this invention.

Another feature of the invention is that heretofore the outer end of the tab attached to the plate has been connected to the computer panel, which requires that the edge of the card be spaced from the panel a distance approximately equal to the length of the tab (which for practical purposes is approximately ½"). The present invention enables the card to be located closer to the panel, the tab projecting outwardly of the housing and thereby making more of the space within the enclosure usable.

A further feature of the invention is that conventionally there are two openings in the panel of the computer enclosure to accommodate two separate cards and the clip of the present invention retains the covers for both openings. Where only one or no cards are used, blocking covers are used and the present invention can retain both a card cover and a blocking cover, two card covers or two blanking covers.

In accordance with the present invention a hole must be formed in the panel adjacent the I/O openings. The portion of the second door retainer of the present invention which fills the hole in the first door has means for filling this hole as the retainer is moved to closed position.

The present invention provides means for attaching the cover to the panel of the enclosure firmly on all axes.

Another feature of the invention is the ease with which the user may move the retainer between operative and inoperative positions.

The present invention comprises two articulated doors mounted on the exterior of a computer enclosure panel adjacent an opening in the panel which is, in turn, adjacent to two I/O openings closed by the covers heretofore described. The first door is hinged to the panel and is formed with an aperture which overlies the margins of the aperture in the panel when the first door is closed. The second door is hinged to the first door and, when in closed position, closes the aperture in the first door but also has an extension which fits inside the enclosure and holds the covers for the I/O openings in place. In addition, the second door has a latch which secures both doors in closed position.

BRIEF DESCRIPTION OF THE DRAWINGS

The accompanying drawings, which are incorporated in and form a part of this specification, illustrate embodiments of the invention and, together with the description serve to explain the principles of the invention.

DETAILED DESCRIPTION OF THE PREFERRED EMBODIMENT

Figure 1:
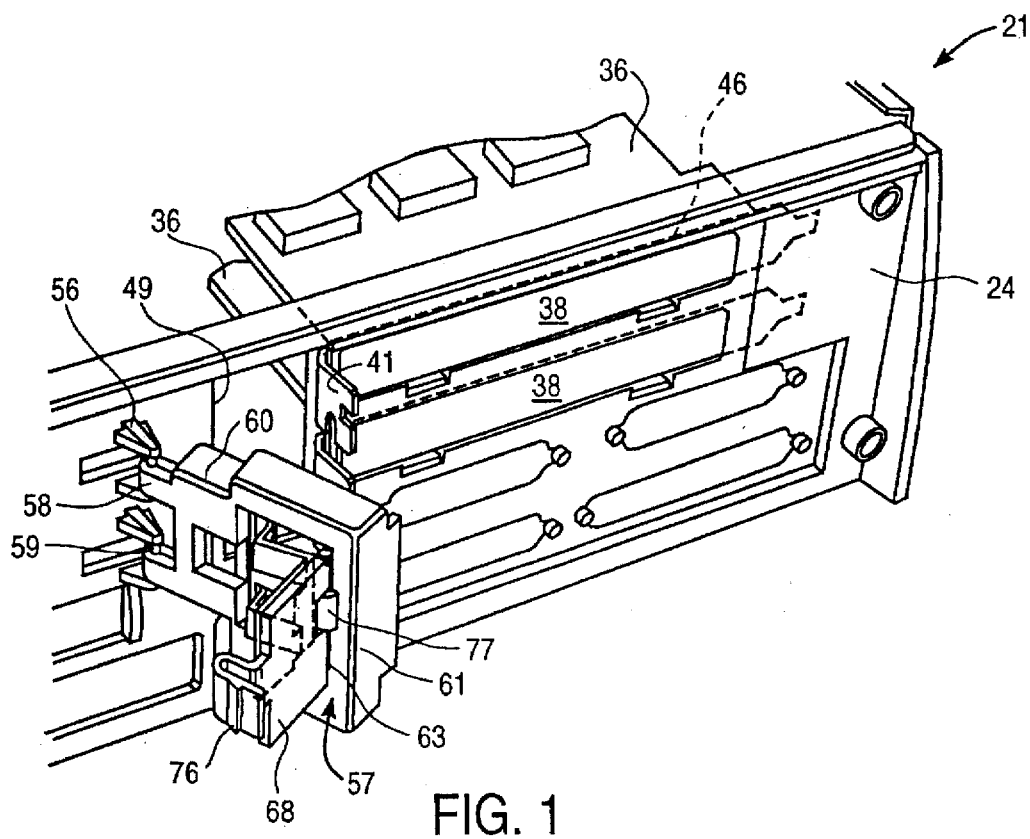
FIG. 1 is a fragmentary perspective view of the retainer of the present invention mounted on the exterior of a panel of a computer enclosure and shown in open position.
Figure 2:
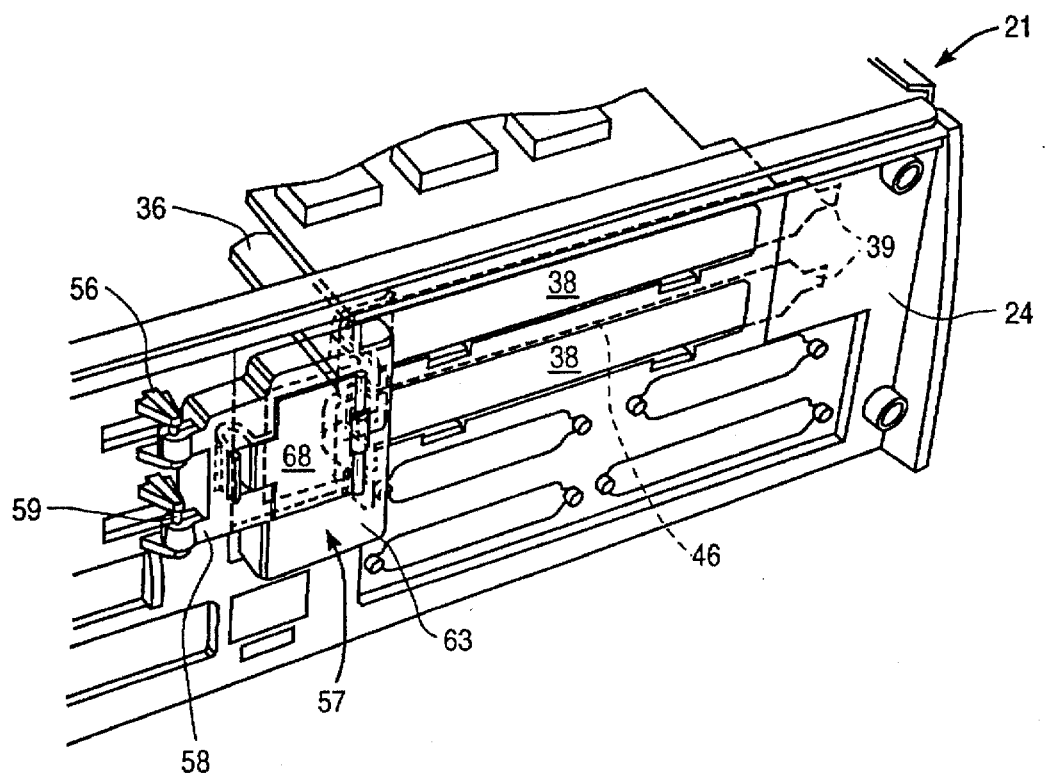
FIG. 2 is a view similar to FIG. 1 showing the retainer in closed position.

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

Enclosure 21 has at least one vertical panel 24, here identified as a rear panel. Adjacent rear panel 24 are two horizontally spaced apart connectors 27 of a type well known in the industry. The PCI cards 36 hereinafter described are plugged into the connectors 27. PCI card 36 is of a type well known in the industry. Technical specifications of such cards are set forth in a publication entitled: *PCI Local Bus Specification, Rev. 2.0, Chapter 5, Mechanical Specification*, published by PCI Special Interest Group of Hillsboro, Oreg. One longitudinal edge of card 36 is connected to one of the connectors 27. A lateral edge of card 36 is formed with an edge reinforcement 37 and externally thereof is a metallic cover 38. Cover 38 has an extending tongue 39 at one end and a laterally outwardly bent tab 41 at its opposite end. In prior practice, a screw (not shown) is used to connect the tab 41 to a bracket (also not shown) on the interior of panel 24. The present invention eliminates the necessity for use of the screw or similar means of attachment. Where no cards 36 are used, blanking covers (not shown) are used to close off openings 46 in panel 24. Such blanking covers have dimensions similar to covers 38, herein described.

Elongated rectangular openings 46 are formed in panel 24, of a length slightly greater than the distance required to disconnect the contacts (not shown) on card 36 from connector 27. Adjacent one end of opening 46 is a tongue receptor 47 which receives tongue 39 and holds it in place. Inward projecting cover edge guides 48 are positioned above and below the longitudinal edges of openings 46 to engage the top and bottom edges of cover 38.

Adjacent openings 46 is an opening 49 which is generally rectangular but is formed with a notch 51 extending in a direction away from openings 46. Opening 49 is used to facilitate insertion and removal of card 36 when the present invention is not employed. Means is provided in accordance with the present invention for closing off the opening 49 and also for retaining covers 38 (or where no card 36 is employed, blanking covers heretofore described). A preferred means for performing this function in accordance with the present invention is the use of two articulated doors mounted on panel 24. Hinge brackets 56 extend outwardly from the exterior of panel 24 to receive straps 58 of first door 57 which extend outward from apertured lateral offset 60 of door 57 and thereby the door 57 is hinged to panel 24 by means of hinge pins 59. Door 57 has an inwardly-extending peripheral flange 61 which in the closed position of the door fits against the exterior of panel 24 surrounding opening 49. Aperture 62, formed in the panel 63 of door 57, is in alignment with opening 49 when door 57 is in closed.

Figure 3:
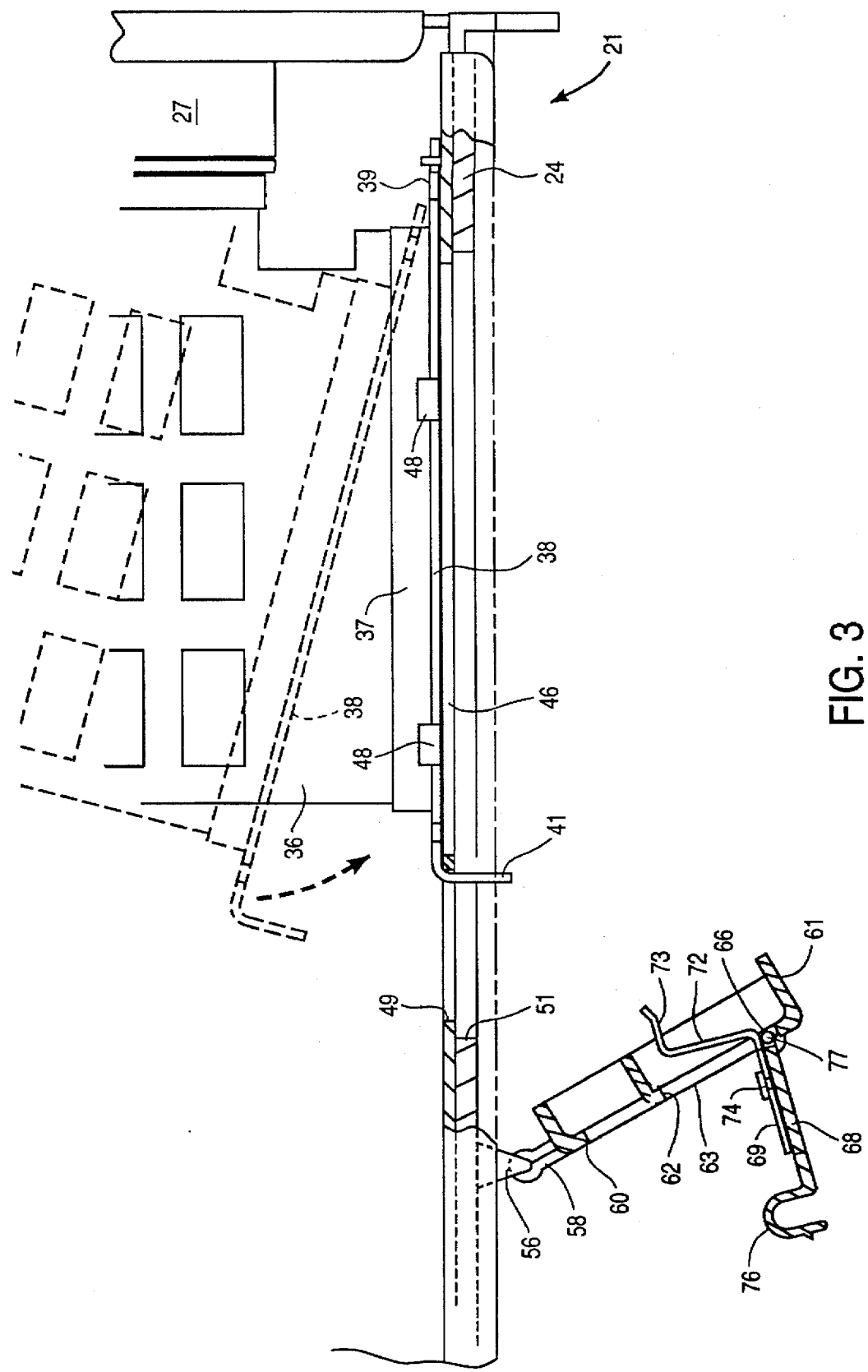
FIG. 3 is an enlarged top plan view partially broken away in section showing the doors open.
Figure 4:
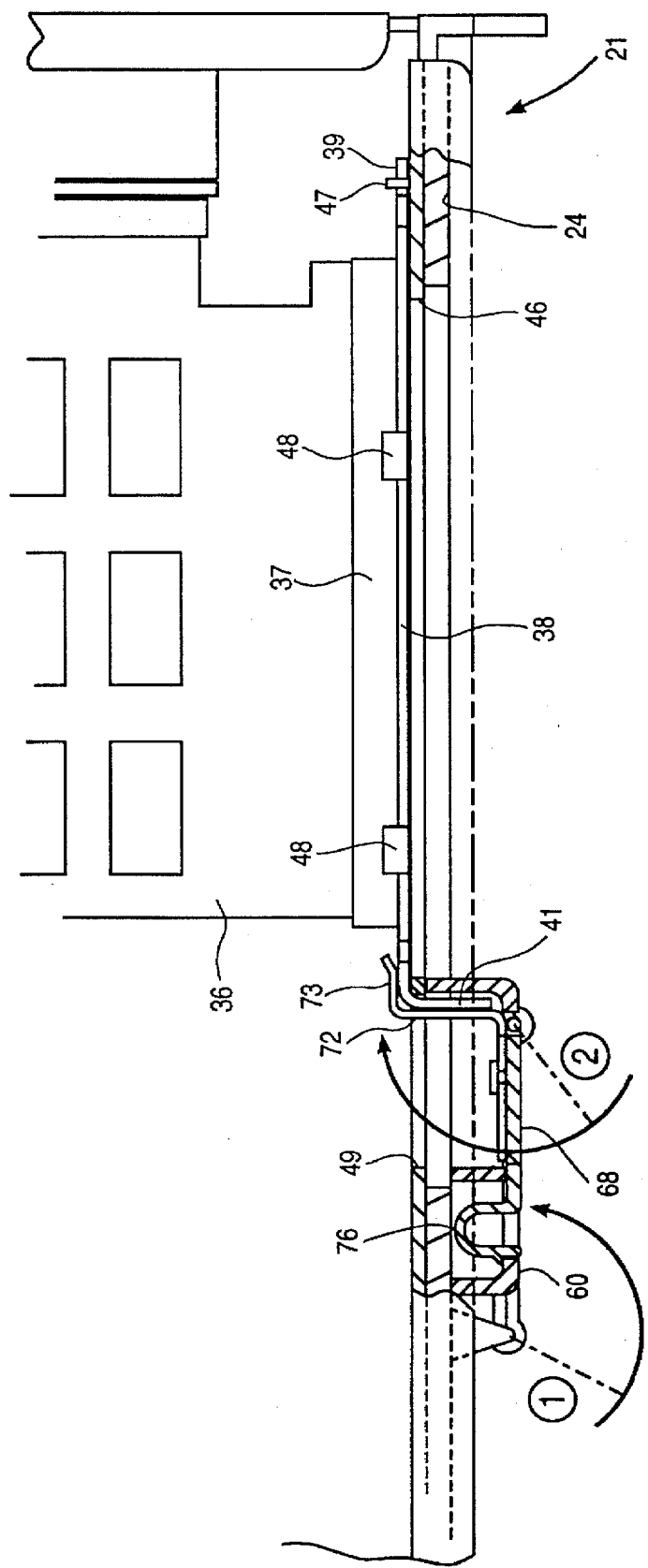
FIG. 4 is a view similar to FIG. 3 showing the doors closed.
Figure 5:
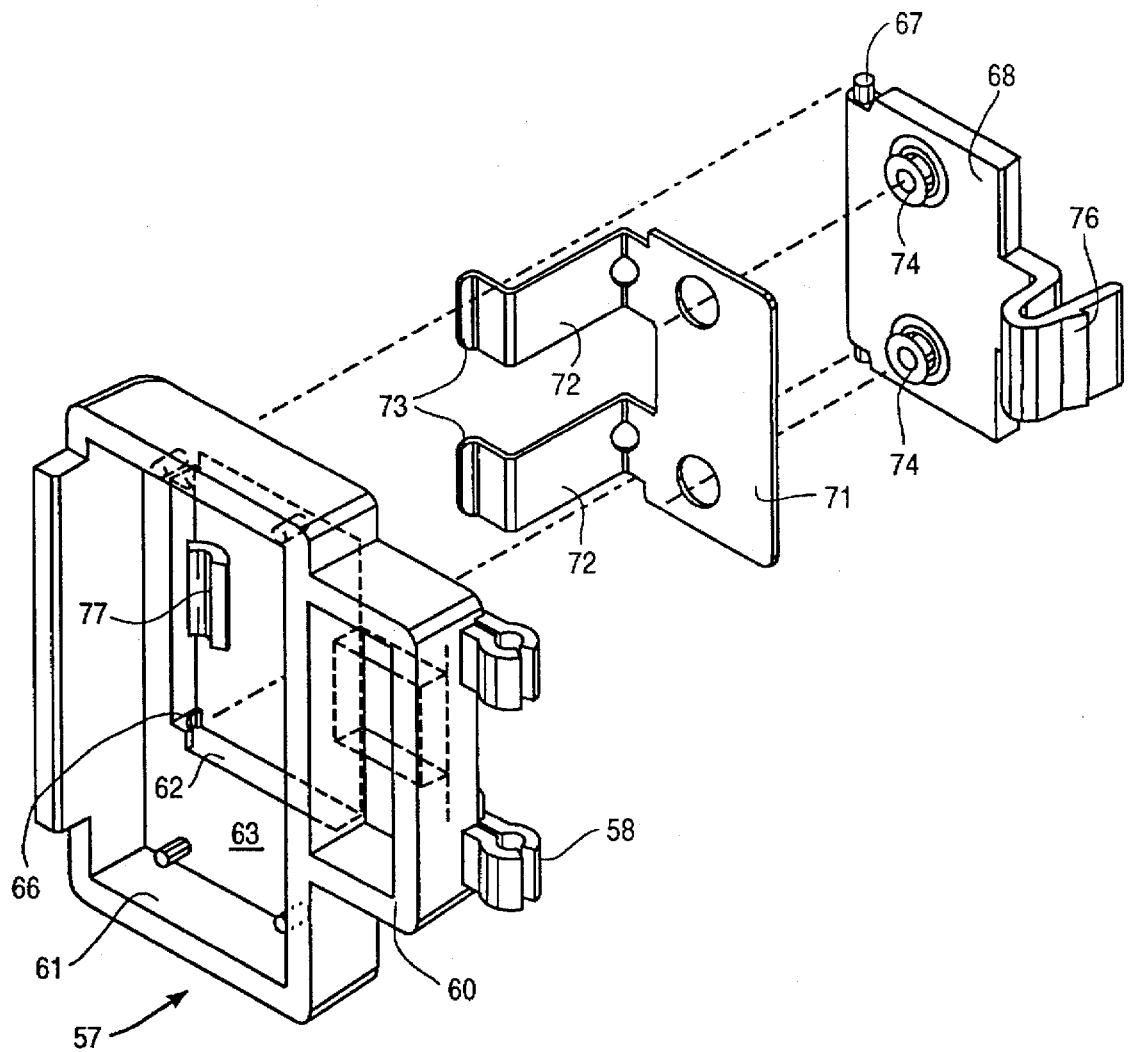
FIG. 5 is a further enlarged exploded prospective view showing the components of the retainer.

Sockets 66 are formed on panel 63 adjacent aperture 62 to receive pintles 67 of second door 68. A latch plate 71 preferably formed of a spring metal is fastened to the interior of door 68 by rivets 74. Plate 71 has an offsets 73 extending inwardly of door 57 in its closed position and on the inner ends of offsets are latches 73. As best shown in FIG. 4, when both doors 57 and 68 are closed, each offset 72 fits against a tab 41 and each latch 73 engages the edge of a cover 68, latching cover 38 in position. Catch 76 formed on an edge of door 68 fits into the aperture in offset 60 in the closed position of the doors and holds door 68 closed. In the preferred embodiment shown in the accompanying drawings, catch 76 may only be released from the inside of enclosure 21 or, in other words, the covers 38 may not be removed from the outside of the enclosure. Stop 77 prevents opening of door 68 beyond the position shown in FIG. 3.

Figure 6:
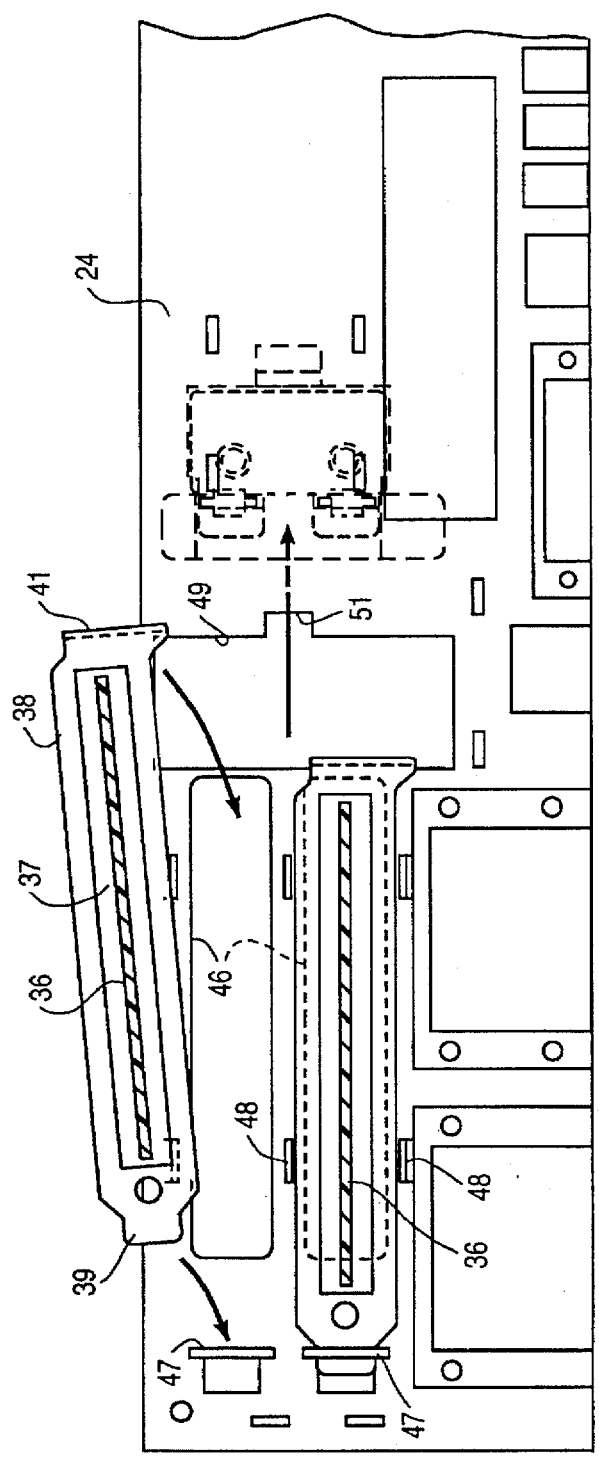
FIG. 6 is a side elevational view of the panel in which the invention is installed showing one cover in process of being installed and showing the retainer fully opened.
Figure 7:
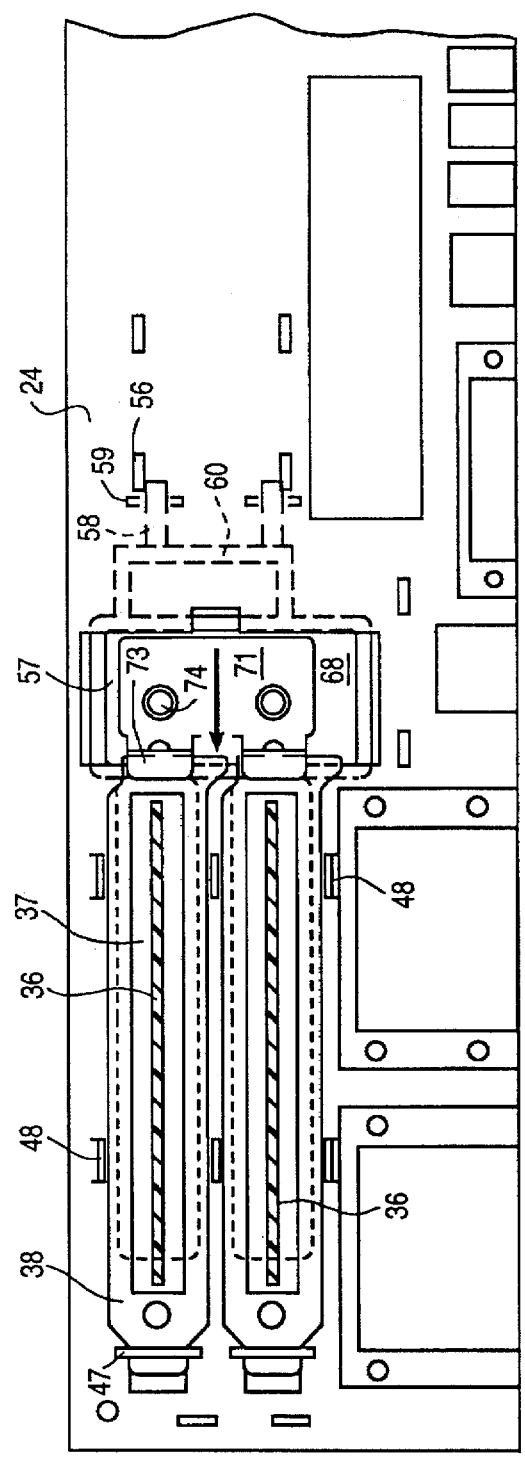
FIG. 7 is a view similar to FIG. 6 showing the retainer fully closed.

In order to install a card, doors 57 and 68 are in open position. As shown in FIG. 6, card 36 installed with the tongue 39 of cover 38 being inserted in tongue receptor 47 and the tab 51 extending outwardly through aperture 49. It will be understood that during this operation an edge of card 36 is inserted in connector 27. With door 68 opened, door 57 is pivoted closed with flange 61 engaging one face of tab 41.

Thereupon door 68 is closed, offset 72 engaging the opposite face of tab 41 and latch 73 engaging the inside of cover 38, thereby locking the cover 38 in position. When it is necessary to remove a card 36, the catch 76 is opened, allowing the door 68 to swing open relative to door 57 and thereupon door 57 is opened. Tab 41 and card 36 may be disengaged by reversal of the installation operation.

What is claimed is:

1. In combination, an enclosure panel formed with a first opening having a first opening end and a second opening end, a cover shaped to close said first opening having a first cover end and a second cover end, first means adjacent said first opening end for securing said first cover end to said panel, said panel being formed with a second opening adjacent but spaced laterally of said first opening, and a retainer for said second cover end, said retainer comprising a latch door, second means mounting said latch door for movement between a first position engaging said panel and a second position remote from said first position, said latch door having a resilient latch engageable with said second cover end when said latch door is in second latch door position to engage said second cover end to retain said cover in position closing off said first opening.

2. The combination of claim 1 which further comprises an apertured door, third means mounting said apertured door on said panel for movement between a first apertured door position overlying said second opening and a second apertured door position remote from said first door position, said third means pivotally mounting said latch door on said apertured door to close off the aperture in said apertured door.

3. The combination of claim 2 in which said cover has a tab extending from the inside of said panel out through said second opening, said apertured door having a flange adjacent said tab when said door is in first apertured door position.

4. The combination of claim 3 in which said resilient latch has an offset engaging said tab when said latch door is in first latch door position.

5. The combination of claim 4 in which said flange and said offset engage opposite surfaces of said top.

6. The combination of claim 1 which further comprises a computer card, said cover being secured to said card.

7. The combination of claim 1 in which said panel is formed with a third opening parallel to and below said first opening, a second cover having a third cover end and a fourth cover end shaped to close said second opening, and third means adjacent said first opening end for securing said third cover end to said panel, said retainer retaining said fourth cover end to said panel when said latch door is in first latch door position.

* * * * *